United States Patent
Chen et al.

(10) Patent No.: US 9,412,925 B2
(45) Date of Patent: Aug. 9, 2016

(54) HIGH-POWER LED LAMP COOLING DEVICE AND METHOD FOR MANUFACTURING THE SAME

(71) Applicant: SUZHOU WEIYUAN NEW MATERIAL TECHNOLOGY CO., LTD., Suzhou (CN)

(72) Inventors: Zhiming Chen, Xiuwen County (CN); Wei Gu, Suzhou (CN)

(73) Assignees: Zhiming Chen, Guizhou (CN); Wei Gu, Suzhou (CN); SUZHOU WEIYUAN NEW MATERIAL TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 14/998,284

(22) Filed: Dec. 24, 2015

(65) Prior Publication Data
US 2016/0133811 A1    May 12, 2016

Related U.S. Application Data

(63) Continuation of application No. PCT/CN2014/078443, filed on May 26, 2014.

(30) Foreign Application Priority Data

Jun. 25, 2013 (CN) .......................... 2013 1 0257924

(51) Int. Cl.
*H01L 21/00* (2006.01)
*H01L 33/64* (2010.01)
(Continued)

(52) U.S. Cl.
CPC ................ *H01L 33/64* (2013.01); *F21V 29/51* (2015.01); *F21V 29/70* (2015.01); *F21Y 2101/02* (2013.01);
(Continued)

(58) Field of Classification Search
CPC ... H01L 33/64; H01L 23/373; H01L 23/3737; H01L 35/30; H01L 35/645; F21V 29/51; F21V 29/70
See application file for complete search history.

(56) References Cited

U.S. PATENT DOCUMENTS 7,344,279 B2 * 3/2008 Mueller ................. F21V 29/83
                                                                362/240
8,143,769 B2 * 3/2012 Li .......................... F21V 29/004
                                                                313/46

(Continued)

FOREIGN PATENT DOCUMENTS

CN    1612371 A    5/2005
CN    201819471 U    5/2011
(Continued)

OTHER PUBLICATIONS

Chinese International Search Report of corresponding International PCT Application No. PCT/CN2014/078443, dated Aug. 26, 2014.
(Continued)

*Primary Examiner* — Nicholas Tobergte
(74) *Attorney, Agent, or Firm* — J.C. Patents

(57) ABSTRACT

A high-power LED lamp cooling device and its manufacturing method, which includes: manufacturing a semiconductor crystal bar in advance into cone-shaped crystal bar with one end having large diameter and the other having small diameter, making color mark on each wafer as the large-diameter end surface of the tail end when the cone-shaped semiconductor crystal bar is cut into slices; cutting and pelletizing the conical surface to obtain polygonal cylindrical N-type or P-type semiconductor elements, arranging them in a matrix form between two beryllium-oxide ceramic chips provided with conductive circuits, connecting head end of N-type semiconductor elements to tail end of the P-type semiconductor elements in series to manufacture high-power LED lamp cooling device. The high-power LED lamp cooling device can achieve: good cooling effect, high working efficiency, low energy consumption and capable of reducing light failure of LED lamp, and prolonging service life of the high-power LED lamp.

6 Claims, 1 Drawing Sheet

(51) Int. Cl.
*F21V 29/51* (2015.01)
*F21V 29/70* (2015.01)
*F21Y 101/02* (2006.01)
*H01L 23/373* (2006.01)
*H01L 35/30* (2006.01)

(52) U.S. Cl.
CPC ........... *H01L 23/373* (2013.01); *H01L 23/3737* (2013.01); *H01L 33/645* (2013.01); *H01L 35/30* (2013.01); *H01L 2933/0075* (2013.01)

(56) References Cited

U.S. PATENT DOCUMENTS

| | | | | |
|---|---|---|---|---|
| 8,616,714 | B2* | 12/2013 | Lee | F21V 29/713 313/46 |
| 8,807,799 | B2* | 8/2014 | Li | F21K 9/135 362/231 |
| 8,809,820 | B2* | 8/2014 | Dahm | B05D 3/067 250/503.1 |
| 8,931,933 | B2* | 1/2015 | Tong | F21K 9/135 362/218 |
| 8,992,051 | B2* | 3/2015 | Yang | F21K 9/1375 362/294 |
| 9,068,701 | B2* | 6/2015 | Progl | F21K 9/135 |
| 9,103,540 | B2* | 8/2015 | Wyrick | F21V 29/22 |
| 9,234,655 | B2* | 1/2016 | Progl | F21V 29/004 |
| 2010/0127299 | A1 | 5/2010 | Smith et al. | 257/99 |

FOREIGN PATENT DOCUMENTS

| | | |
|---|---|---|
| CN | 102194950 A | 9/2011 |
| CN | 102297544 A | 12/2011 |
| CN | 202521346 U | 11/2012 |
| CN | 102810620 A | 12/2012 |
| CN | 103353098 A | 10/2013 |
| CN | 103398358 A | 11/2013 |
| CN | 203336367 U | 12/2013 |
| CN | 203336546 U | 12/2013 |
| WO | WO 2012/015161 A1 | 2/2012 |

OTHER PUBLICATIONS

Chinese First Examination Report of corresponding China patent application No. 201310257924.5, dated Nov. 28, 2014.

* cited by examiner

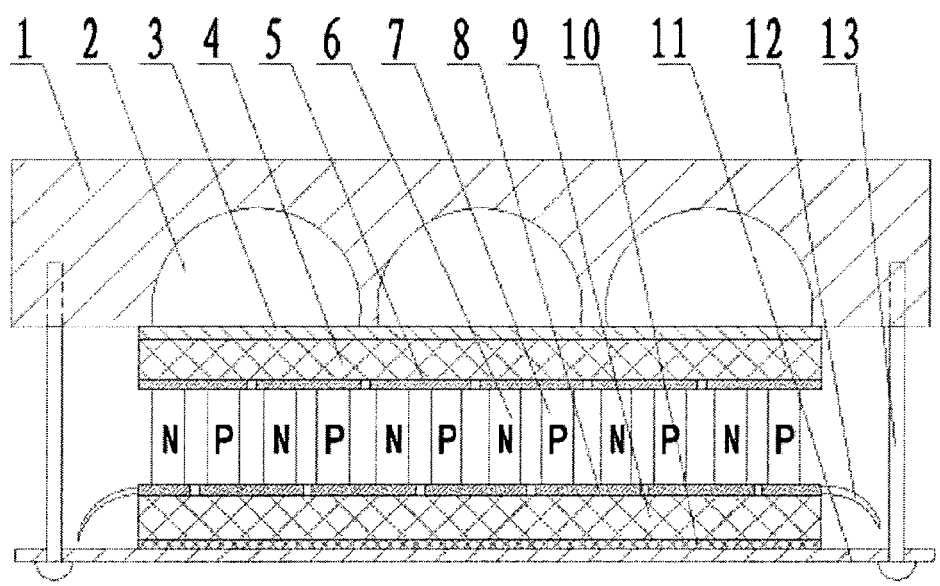

US 9,412,925 B2

HIGH-POWER LED LAMP COOLING DEVICE AND METHOD FOR MANUFACTURING THE SAME

CROSS-REFERENCE TO RELATED APPLICATIONS

This application is a continuation of International Application No. PCT/CN2014/078443, filed on May 26, 2014, which claims priority to Chinese Patent Application No. 201310257924.5, filed on Jun. 25, 2013, both of which are hereby incorporated by reference in their entireties.

TECHNICAL FIELD

The present invention relates to a high-power LED lamp cooling device and a method for manufacturing the same, which belongs to the field of heat-dissipating and cooling technology for a high-power LED lamp.

BACKGROUND

The light-emitting efficiency of an LED lamp not only depends on quality of LED lamp bulb, but more importantly also depends on the temperature of the LED lamp during operation, especially when a high-power LED lamp is in operation, once the temperature is above 55° C., the light-emitting efficiency thereof reduces by about 2% for each degree increase in temperature, and therefore, cooling treatment is very important when an LED lamp, especially a high-power LED lamp is in operation. In the prior art, the high-power LED lamp is usually cooled by air cooling or with a semiconductor cooling device. The feature, that different temperatures are generated at a hot end and a cold end of a P-type semiconductor element and an N-type semiconductor element while being energized, has been widely applied in the field of manufacturing a semiconductor cooling or heating device. Currently, when the N-type or P-type semiconductor elements are used to manufacture a cooling device, directions of the N-type or P-type semiconductor elements are always not taken into account, that is, when the N-type or P-type semiconductor elements are connected, the head end and the tail end of the N-type or P-type semiconductor elements are not distinguished, but arbitrary ends of the N-type or P-type semiconductor elements are connected mutually, such a mode of connection irrespective of the head end and the tail end not only reduces working efficiency of the semiconductor element, increases energy consumption, but also makes the manufactured cooling device fail to reach a required cooling temperature. Generally speaking, in terms of the cooling device manufactured with the traditional method, the temperature difference between the hot end and the cold end thereof only can reach about 60 degrees. Accordingly, the effect of usage of the existing P-type semiconductor elements and N-type semiconductor elements for manufacturing a cooling device, especially a high-power LED lamp cooling device is less than desired.

SUMMARY

In order to overcome the defects in the prior art, an object of the present invention is to provide a high-power LED lamp cooling device and a method for manufacturing the same, which is featured by a better cooling effect, higher working efficiency and lower energy consumption.

The present invention are implemented as follows: in the method for manufacturing a high-power LED lamp cooling device made of N-type semiconductor elements or P-type semiconductor elements, when the N-type semiconductor elements or the P-type semiconductor elements are used to manufacture the high-power LED lamp cooling device, manufacturing a semiconductor crystal bar used for manufacturing N-type semiconductor elements or P-type semiconductor elements in advance into a cone-shaped crystal bar of which one end has a large diameter and the other end has a small diameter, cutting the cone-shaped semiconductor crystal bar into slices to obtain wafers with the same thickness, the small-diameter end of the wafer being the head end the large-diameter end being the tail end, and then making a color mark on the tail end surface of each wafer; and then cutting and pelletizing the conical surface of each wafer to the same polygonal cylindrical shape, the polygonal cylindrical semiconductor is the N-type semiconductor elements or the P-type semiconductor elements with a head end and a tail end, arranging the N-type semiconductor elements and the P-type semiconductor elements in a matrix form between two beryllium-oxide ceramic chips which are provided with conductive circuits, and connecting each column of N-type semiconductor elements to the P-type semiconductor elements in series mutually, so that the head end of each column of N-type semiconductor elements in series is connected to the tail end of the P-type semiconductor elements or the tail end of each column of N-type semiconductor elements is connected to the head end of the P-type semiconductor elements.

The polygonal cylinder is a quadrangular, or square, or regular hexagonal, or regular octagonal, or regular decagonal or regular dodecagonal cylinder.

A high-power LED lamp cooling device constructed according to the above method, includes: N-type semiconductor elements and P-type semiconductor elements arranged in a matrix form between an upper beryllium-oxide ceramic wafer and a lower beryllium-oxide ceramic wafer which are provided with conductive circuits, an end of both the N-type semiconductor and the P-type semiconductor is provided with a conductive color mark, the end with the color mark is regarded as the tail end of the N-type semiconductor element or the P-type semiconductor element, the end without the color mark is regarded as the head end of the N-type semiconductor element or the P-type semiconductor element, each column of N-type semiconductor element and each column of P-type semiconductor element are connected in series respectively through an upper conductive plate provided on the upper beryllium-oxide ceramic wafer and through a lower conductive plate provided on the lower beryllium-oxide ceramic wafer, and the head end of each column of N-type semiconductor element is connected with the tail end of each column of P-type semiconductor element or the tail end of each column of N-type semiconductor element is connected with the head end of each column of P-type semiconductor element, each column of N-type semiconductor element and each column of P-type semiconductor element are connected with a direct current power source through a conductive wire on the upper conductive plate or the lower conductive plate provided at two outmost ends of the column.

A beryllium copper plate pressing block is attached on the upper surface of the upper beryllium-oxide ceramic wafer, a heat dissipating aluminum base is mounted on the beryllium copper plate pressing block, the bottom surface of the lower beryllium-oxide ceramic wafer is attached with a heat-conducting uniform temperature plate, through a graphene thermal conductive greaseon layer, the heat-conducting uniform temperature plate is provided with a high-power LED lamp circuit which is mounted with an LED bulb, and both ends of the heat-conducting uniform temperature plate are connected to the aluminum base with screws, respectively.

The aluminum base is provided with a thermal pipe mounting hole for mounting a thermal conductive pipe of the heat sink.

The heat-conducting uniform temperature plate is a printed circuit board for mounting a high power LED lamp circuit of an LED bulb.

Due to the above technical solution, based on the conventional manufacturing of N-type semiconductor element and P-type semiconductor element, the semiconductor crystal bar is made with a color mark after being cut, so that the head end and tail end of the N-type semiconductor element or the P-type semiconductor element can be distinguished in a convenient way, and the arranging orientation of the head end or tail end is in consistent with that of the crystal bar before being cut. In this way, when the semiconductor element in the present invention is used, it is easy to distinguish the tail end and the head end, thus avoiding the occurrence of disordered connection when the N-type semiconductor element is connected in the prior art due to the undistinguishable head end and tail end. When the N-type or P-type semiconductor elements in the present invention are used to manufacture a cooling device, orderly connection in a head-to-tail sequence can be achieved in a convenient way, thereby effectively improving working efficiency of each N-type or P-type semiconductor element, as well as a cooling effect of the entire cooling device. Through a test, when the high-power LED lamp cooling device manufactured according to the present invention is adopted, the temperature difference between the cold end and the hot end thereof reaches about 73° C. to 78° C., when the cooling device according to the present invention is mounted to a high-power LED lamp of 200 W for use, it can be ensured that the circuit board of the high-power LED lamp can be stabilized under 45° C. for a long time, thus effectively improving working efficiency of the high-power LED lamp and prolonging the service life of the high-power LED lamp. Therefore, as compared with the prior art, the present invention not only has a good cooling effect, a high working efficiency and a low energy consumption, but is also capable of reducing the light failure of a high power LED lamp, and prolonging the service life of the high-power LED lamp.

BRIEF DESCRIPTION OF THE DRAWINGS

FIG. 1 is a structural schematic diagram of the present invention.

Reference signs: 1-Aluminum base, 2-Thermal pipe mounting hole, 3-Beryllium copper plate pressing block, 4-Upper beryllium-oxide ceramic wafer, 5-Upper conductive plate, 6-N-type semiconductor element, 7-P-type semiconductor element, 8-Lower conductive plate, 9-Lower beryllium-oxide ceramic wafer, 10-Graphene thermal conductive grease layer, 11-Heat-conducting uniform temperature plate, 12-Conductive wire, 13-Screw.

DESCRIPTION OF EMBODIMENTS

The present invention is described below in further detail with reference to accompanying drawings and the embodiments.

The embodiments are as follows: in the method for manufacturing a high-power LED lamp cooling device made of N-type semiconductor elements or P-type semiconductor elements, when the N-type semiconductor elements or the P-type semiconductor elements are used to manufacture the high-power LED lamp cooling device using a traditional process, manufacturing a semiconductor crystal bar used for manufacturing N-type semiconductor elements or P-type semiconductor elements into a cone-shaped crystal bar in advance, of which one end has a large diameter and the other end has a small diameter, cutting the cone-shaped semiconductor crystal bar into slices to obtain wafers with the same thickness, the small-diameter end of the wafer being the head end the large-diameter end being the tail end, and then making a color mark on the tail end surface of each wafer with colors made of conductive materials (for example, color materials made of conductive materials, such as copper, aluminium or silver); and then cutting and pelletizing the conical surface of each wafer to the same polygonal cylinder shape, the polygonal cylinder can be made as a quadrangular, square, regular hexagonal, regular octagonal, regular decagonal or regular dodecagonal cylinder according to needs of use, the manufactured semiconductor with polygonal cylinder shape is the N-type semiconductor elements or the P-type semiconductor elements with a head end and a tail end; arranging the N-type semiconductor elements and the P-type semiconductor elements in a traditional matrix form between two beryllium-oxide ceramic chips which are provided with conductive circuits, and connecting each column of N-type semiconductor elements to the P-type semiconductor elements in series mutually, so that the head end of each column of N-type semiconductor elements in series can be connected to the tail end of the P-type semiconductor elements or the tail end of each column of N-type semiconductor elements can be connected to the head end of the P-type semiconductor elements.

The structural schematic diagram of the high-power LED lamp cooling device constructed according to the above method is as shown in FIG. 1, and the cooling device includes: N-type semiconductor elements 6 and P-type semiconductor elements 7 arranged, in a matrix form, between an upper beryllium-oxide ceramic wafer 4 and a lower beryllium-oxide ceramic wafer 9 which are provided with conductive circuits, an end of both the N-type semiconductor 6 and the P-type semiconductor 7 is provided with a conductive color mark, the end with the color mark is regarded as the tail end of the N-type semiconductor element 6 or of the P-type semiconductor element 7, the end without the color mark is regarded as the head end of the N-type semiconductor element 6 or of the P-type semiconductor element 7, each column of N-type semiconductor element 6 and each column of P-type semiconductor element 7 are connected in series respectively through an upper conductive plate 5 provided on the upper beryllium-oxide ceramic wafer 4 and through a lower conductive plate 8 provided on the lower beryllium-oxide ceramic wafer 9, and the head end of each column of N-type semiconductor element 6 is connected with the tail end of each column of P-type semiconductor element 7 or the tail end of each column of N-type semiconductor element 6 is connected with the head end of each column of P-type semiconductor element 7, each column of N-type semiconductor element 6 and each column of P-type semiconductor element 7 are connected with the direct current power source through a conductive wire 12 on the upper conductive plate 5 or the lower conductive plate 8 provided at two outmost ends of the column (as shown in FIG. 1); during manufacturing, a beryllium copper plate pressing block 3 is attached on the upper surface of the upper beryllium-oxide ceramic wafer 4, a heat dissipating aluminum base 1 is mounted on the beryllium copper plate pressing block 3, and meanwhile, the aluminum base 1 is manufactured with a thermal pipe mounting hole 2 for mounting a thermal conductive pipe of the heat sink; the bottom surface of the lower beryllium-oxide ceramic wafer 9 is attached with a heat-conducting uniform temperature plate 11, through a graphene thermal conductive greaseon layer 10, the heat-conducting uniform temperature plate 11 is manufactured with a high-power LED lamp circuit which is mounted with an LED bulb according to a traditional high-power LED lamp circuit, and the heat-conducting uniform temperature plate 11 also can directly adopt the existing printed circuit board for mounting a high power LED lamp circuit of an LED bulb; and finally both ends of the heat-conducting uniform temperature plate 11 are connected to the aluminum base 1 with screws 13, respectively.

When using the high-power LED lamp cooling device according to the present invention, it is only necessary to mount the device within a high-power LED lamp housing, mount the LED bulb on the heat-conducting uniform temperature plate 11, meanwhile clamp the thermal conductive pipe of the heat sink into the thermal pipe mounting hole 2 of the aluminum base 1, and connect power lines on the conductive wire 12 and the heat-conducting uniform temperature plate 11 respectively with the direct current power source.

What is claimed is:

1. A method for manufacturing a high-power LED lamp cooling device, comprising using an N-type semiconductor element and a P-type semiconductor element as a cooling component of the high-power LED lamp cooling device, and comprising: when the N-type semiconductor element and the P-type semiconductor element are used as cooling component of the high-power LED lamp cooling device, manufacturing a semiconductor crystal bar used for manufacturing the N-type semiconductor elements or the P-type semiconductor elements in advance into a cone-shaped crystal bar, of which one end has a large diameter and the other end has a small diameter, cutting the cone-shaped semiconductor crystal bar into slices to obtain wafers with the same thickness, the small-diameter end of the wafer being the head end and the large-diameter end being the tail end, and then making a color mark on the tail end surface of each wafer; and then cutting and pelletizing the conical surface of each wafer to the same polygonal cylindrical shape, the polygonal cylindrical semiconductor is the N-type semiconductor elements or the P-type semiconductor elements with a head end and a tail end, arranging the N-type semiconductor elements and the P-type semiconductor elements in a matrix form between two beryllium-oxide ceramic chips which are provided with conductive circuits, and connecting each column of N-type semiconductor elements to the P-type semiconductor elements in series mutually, so that the head end of each column of N-type semiconductor elements in series is connected to the tail end of the P-type semiconductor elements or the tail end of each column of N-type semiconductor elements is connected to the head end of the P-type semiconductor elements.

2. The method for manufacturing a high-power LED lamp cooling device according to claim 1, wherein, the polygonal cylinder is a quadrangular, or square, or regular hexagonal, or regular octagonal, or regular decagonal or regular dodecagonal cylinder.

3. A high-power LED lamp cooling device, comprising: N-type semiconductor elements (6) and P-type semiconductor elements (7) arranged in a matrix form between an upper beryllium-oxide ceramic wafer (4) and a lower beryllium-oxide ceramic wafer (9) which are provided with conductive circuits, wherein, an end of both the N-type semiconductor (6) and the P-type semiconductor (7) is provided with a conductive color mark, the end with the color mark is regarded as the tail end of the N-type semiconductor element (6) or the P-type semiconductor element (7), the end without the color mark is regarded as the head end of the N-type semiconductor element (6) or the P-type semiconductor element (7), each column of N-type semiconductor element (6) and each column of P-type semiconductor element (7) are connected in series respectively through an upper conductive plate (5) provided on the upper beryllium-oxide ceramic wafer (4) and through a lower conductive plate (8) provided on the lower beryllium-oxide ceramic wafer (9), and the head end of each column of N-type semiconductor element (6) is connected with the tail end of each column of P-type semiconductor element (7) or the tail end of each column of N-type semiconductor element (6) is connected with the head end of each column of P-type semiconductor element (7), each column of N-type semiconductor element (6) and each column of P-type semiconductor element (7) are connected with a direct current power source through a conductive wire (12) on the upper conductive plate (5) or the lower conductive plate (8) provided at two outmost ends of the column.

4. The high-power LED lamp cooling device according to claim 3, wherein, a beryllium copper plate pressing block (3) is attached on an upper surface of the upper beryllium-oxide ceramic wafer (4), a heat dissipating aluminum base (1) is mounted on the beryllium copper plate pressing block (3), a bottom surface of the lower beryllium-oxide ceramic wafer (9) is attached with a heat-conducting uniform temperature plate (11), through a graphene thermal conductive greaseon layer (10), the heat-conducting uniform temperature plate (11) is provided with a high-power LED lamp circuit which is mounted with an LED bulb, and both ends of the heat-conducting uniform temperature plate (11) are connected to the aluminum base (1) with screws (13), respectively.

5. The high-power LED lamp cooling device according to claim 4, wherein, the aluminum base (1) is manufactured with a thermal pipe mounting hole (2) for mounting a thermal conductive pipe of the heat sink.

6. The high-power LED lamp cooling device according to claim 4, wherein, the heat-conducting uniform temperature plate (11) is a printed circuit board for mounting a high power LED lamp circuit of an LED bulb.

* * * * *